United States Patent
Sheldon et al.

[19]

[11] Patent Number: 6,118,384
[45] Date of Patent: Sep. 12, 2000

[54] BATTERY MONITOR WITH SOFTWARE TRIM

[75] Inventors: Peter Sheldon; Paul Schnizlein; Alan Hendrickson, all of Austin, Tex.

[73] Assignee: Advanced Micro Devices, Inc., Sunnyvale, Calif.

[21] Appl. No.: 09/110,798

[22] Filed: Jul. 6, 1998

Related U.S. Application Data

[63] Continuation of application No. 08/914,017, Aug. 1, 1997, which is a continuation of application No. 08/581,358, Dec. 29, 1995, abandoned.

[51] Int. Cl.⁷ .................................................. G08B 21/00
[52] U.S. Cl. .................. 340/636; 340/660; 340/661; 324/426; 324/427; 455/127; 455/343
[58] Field of Search .................. 340/635, 636, 340/660, 661, 825.83; 324/426, 427; 455/38.3, 127, 343

[56] References Cited

U.S. PATENT DOCUMENTS

| | | | |
|---|---|---|---|
| 5,432,741 | 7/1995 | Devore et al. | 365/185 |
| 5,563,549 | 10/1996 | Shieh | 327/543 |
| 5,631,537 | 5/1997 | Armstrong | 320/15 |
| 5,652,721 | 7/1997 | McIntyre | 365/185.18 |
| 5,761,206 | 6/1998 | Kackman | 370/476 |
| 5,880,996 | 3/1999 | Roohparvar | 365/185.33 |

OTHER PUBLICATIONS

Graf, Encyclopedia of Electronic Circuits, vol. 1, p. 157, 1985.

*Primary Examiner*—Daniel J. Wu

[57] ABSTRACT

A battery monitor with programmable voltage references. The battery monitor includes a comparator circuit connected to a battery for receiving a voltage level thereof and to a voltage reference circuit for receiving a at least one reference voltage generated thereby. A trim circuit is connected to the voltage reference circuit for adjusting the reference voltage(s) and generated by the voltage reference circuit. The comparator circuit compares the voltage level of the battery with the reference voltage(s) generates an output based on the relative value of the battery voltage compared to the reference voltage(s). The trim circuit is programmable and includes a microprocessor connected to a programmable register and a memory. The microprocessor obtains trim data from the memory and writes the trim data to the programmable register.

12 Claims, 11 Drawing Sheets

BATTERY MONITOR WITH SOFTWARE TRIM

This application is a continuation of application Ser. No. 08/914,017 filed on Aug. 1, 1997, which is incorporated herein by reference and which is a continuation of application Ser. No. 08/581,358 filed on Dec. 29, 1995, now abandoned.

BACKGROUND ON THE INVENTION

The present invention relates to battery monitors and, more particularly, to a battery monitor that incorporates a software trim.

In order for portable electronic devices to operate properly, they generally require a portable power source, which is typically provided in the form of batteries. Each battery type has its own discharge characteristics that depend on the load characteristics it operates under. In order to provide reliable operation of the portable device, it is often desirable to monitor the battery's charge level to assure that the charge is sufficient to reliably operate the portable electronic device. In the event the charge level of the battery falls below a certain level, or levels, it may be desirable to warn the user that the battery requires recharging. Further, when the battery falls below a critical level, it is desirable to stop all operations of the portable electronic device to prevent undesirable operations. This situation is particularly evident when the portable devise operates as a portable telephone or radio which, in uncertain operating condition, may disseminate undesirable electromagnetic radiation.

Prior battery monitors have typically been external devices to integrated circuits in portable electronic devices. Those external battery monitors have required inclusion of additional components on the system board, as well as additional external pins on the integrated circuit. Those requirements increase the amount of board space necessary to accommodate the components and pins. The required additional board space, components, and external pins increases expense of the devices. These requirements are particularly undesirable with the now increasing demands for miniaturization and decreased cost.

The prior battery monitors have also typically varied widely in the accuracy of charge detection achieved by the monitors. It is desirable to accurately detect battery charge level, for example, to enable longer and more accurate usage of portable electronic devices. In the conventional battery monitors, fuse pads on the periphery of the battery monitor's integrated circuit have allowed for accuracy adjustment. In particular, each battery monitor has been individually testable for accuracy and adjustable by means of "blowing" or opening predetermined fuse pads on the battery monitor's periphery. This practice has resulted, however, in a number of problems. For example, the fuse pads consume space on the battery monitor's periphery which could otherwise be used for other functions. Moreover, it is possible for the opened fuse pads to become shorted out or corroded during operations, thus causing the battery monitor to return to its original state.

In order for digital integrated circuits to operate properly, it is generally necessary to first cause the circuitry of the integrated circuit to start from a known state, before it performs other operations. Once the circuitry is in the known state, operations of the circuitry can then be conducted in an orderly and predictable fashion. Typically, this known state is called the reset state. According to particular design, the reset state may occur, for example, when power is first applied to the integrated circuit. Design may also cause the integrated circuit to be reset to the reset state while power is applied during operations for various reasons. In certain applications it is also desirable that the integrated circuit monitor various internal and external conditions and that the integrated circuit reset to the state if any of those conditions are not as expected for desired operation or raise questions about that operation.

One internal condition that may be, and frequently is, monitored for the aforementioned reasons is selected operational states of a microcontroller or other integrated circuits that execute instructions, such as microcode, firmware or software, incorporated in the integrated circuit. For appropriate operation of the integrated circuit the microcontroller must process instructions in an orderly fashion. It may happen, from time to time, that, through inadvertent efforts in the instructions or circuitry, other unforeseen events, or even other occurrences, the microcontroller or software controlling it operates in an unexpected or undesirable manner. When this occurs, it is in the many instances desirable to reset the integrated circuit before allowing the microcontroller or software to resume normal operations.

In instances in which an integrated circuit is powered by a battery or other depleting power source, an external condition that may be monitored is the charge level in the battery. Monitoring the battery's charge level may be desirable because once the charge falls below a certain level, it may be hard, if not impossible, to predict the operation of the integrated circuit. In order to avoid the uncertainly in those cases, it may be desirable to cause the integrated circuit, or portions of it, to maintain a particular state or even shutdown when the charge level of the battery or other power source has depleted to a critical level.

The unpredictability of an integrated circuit powered by a battery having a low charge, or whose software is not operating properly is of particular concern when the integrated circuit operates to control a wireless communication device, such as a portable phone or radio. This concern arises because of the need to prevent the device from sending out undesirable electromagnetic signals.

Heretofore, integrated circuits have utilized external battery monitors which have necessitated additional components on the system board as well as additional external pins on the integrated circuit. This has resulted in increased board space and greater expense, both of which conditions are undesirable with the increased need for miniaturization and decreased cost.

What is needed, therefore is a battery monitor arrangement that addresses the above identified problems. The present invention provides these and other advances and improvements in the technology and art.

SUMMARY OF THE INVENTION

The present invention relates to battery monitors and, more particularly, to a battery monitor that incorporates a software trim. To this end, a comparator connected to the battery receives as inputs thereto the voltage of the battery and one or more reference voltages generated by a voltage reference circuit. A trim circuit is also connected to the voltage reference circuit to adjust voltages generated by the voltage reference circuit. The comparator circuit compares the voltage of the battery with the reference voltage(s) and generates one or more outputs based on the relative value of the battery voltage compared to the reference voltage(s)

The trim circuit may be programmable and may consist of a programmable register connected to a microprocessor. The microprocessor is in turn connected to a memory from which the microprocessor obtains trim data which is written to the programmable register for controlling the reference voltage(s) generated by the voltage reference circuit.

DESCRIPTION OF THE PREFERRED EMBODIMENT

Figure 1:
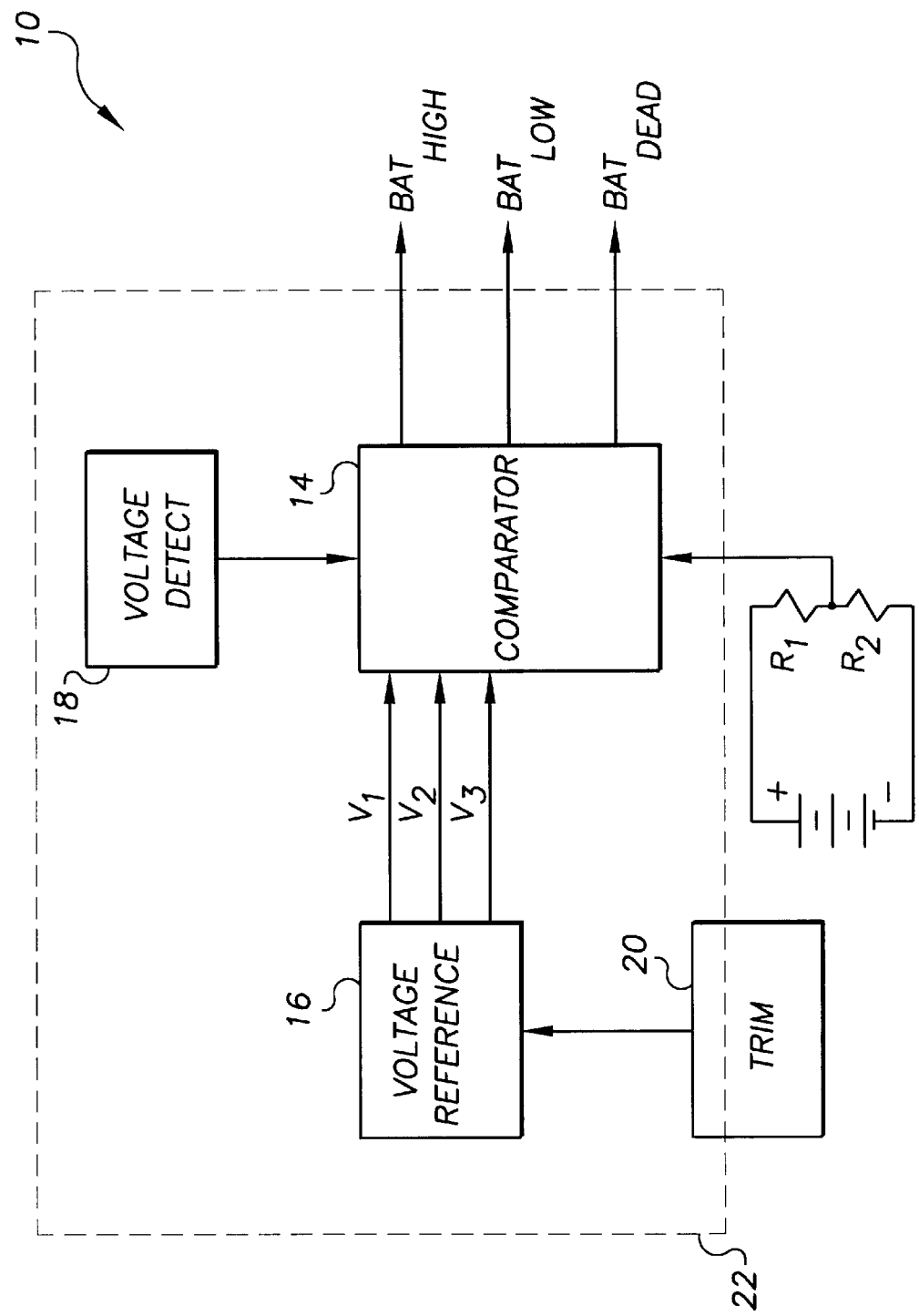
FIG. 1 is a block diagram of a battery monitor with software trim embodying features of the present invention.

Referring to FIG. 1, the reference numeral 10 refers in general to an embodiment of a battery monitor embodying features of the present invention. The battery monitor 10 comprised of a battery 12 connected in series to two resistors $R_1$ and $R_2$. It is understood that the resistors $R_1$ and $R_2$ comprise a voltage divider. The centerpoint of this $R_1$–$R_2$ voltage divider is used as an input to a comparator circuit 14. The comparator circuit 14 accepts three inputs $V_1$, $V_2$ and $V_3$. from a voltage reference circuit 16. The comparator circuit 14 also receives as an input $V_{DET}$ from a voltage detect circuit 18. The voltage reference circuit 16 also accepts an input from a trim circuit 20. The comparator circuit 14 has three outputs $BAT_{HIGH}$, $BAT_{LOW}$ and $BAT_{DEAD}$. It is understood that in the preferred embodiment of the battery monitor 10, the comparator circuit 14, voltage reference circuit 16, voltage detect circuit 18 and portions of the trim circuit 20 are fabricated on a single integrated circuit 22.

Figure 2:
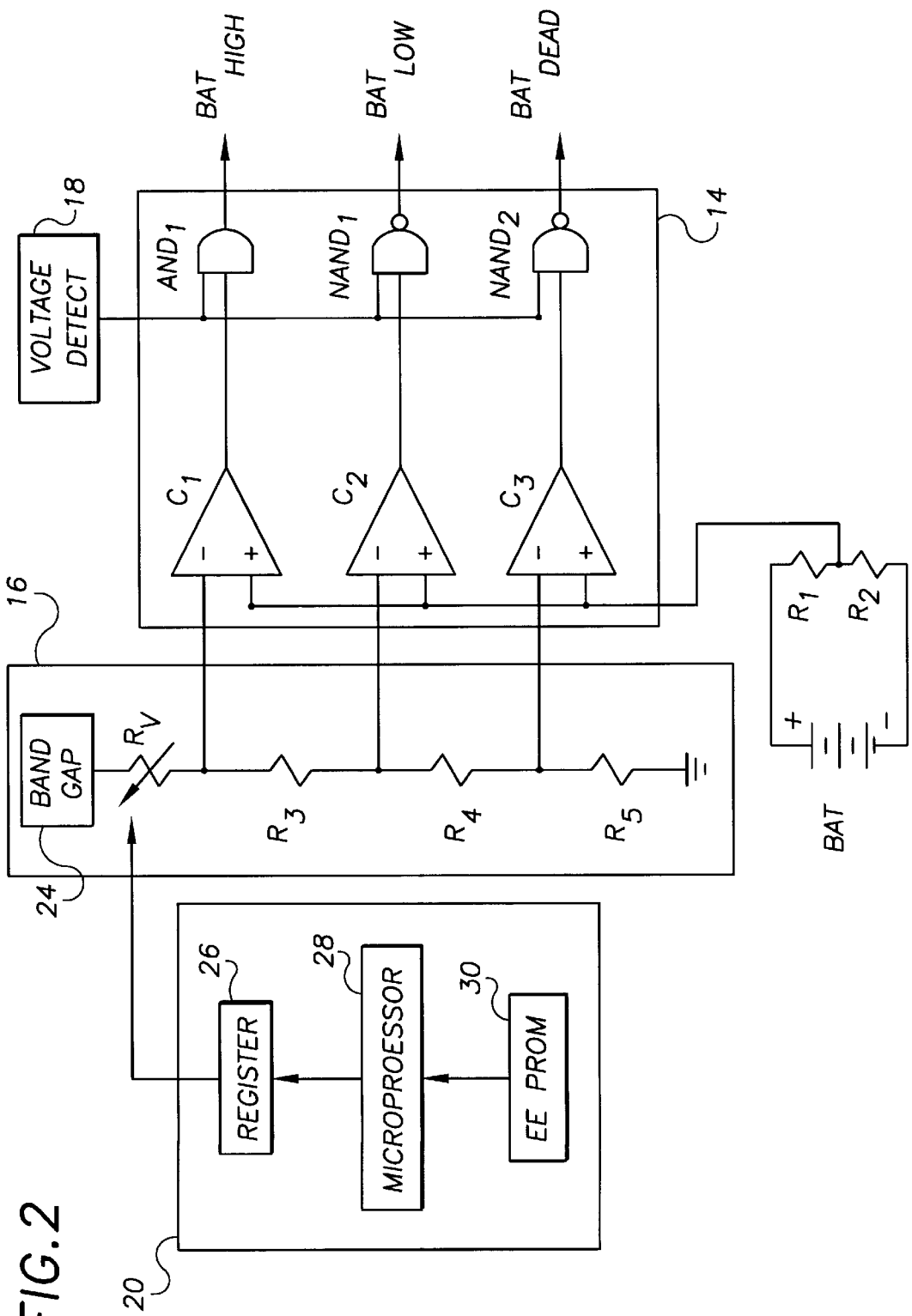
FIG. 2 is a detailed block diagram of the battery monitor of FIG. 1.
Figure 3A:
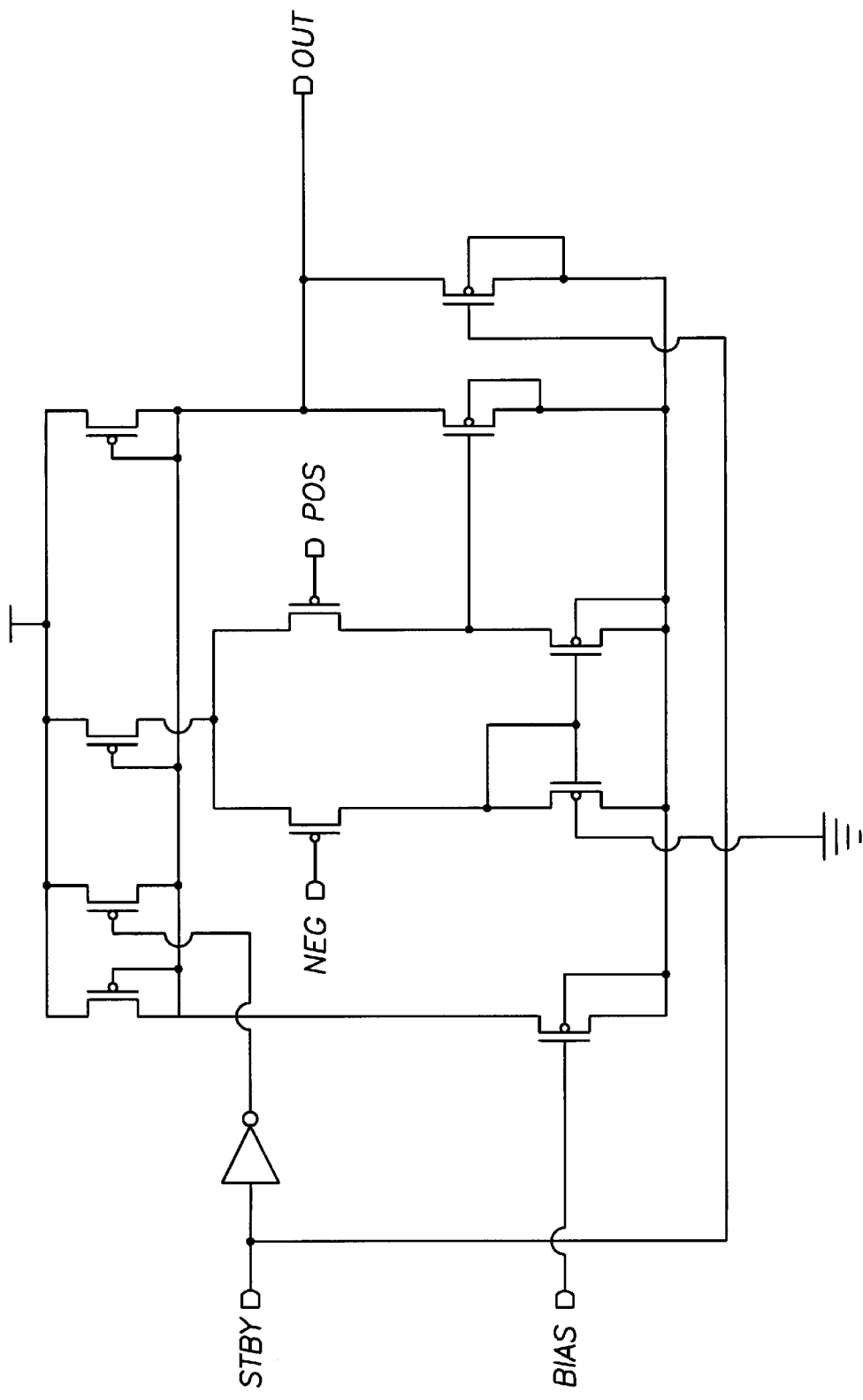
FIG. 3A–3F are schematic diagrams of one embodiment of the battery monitor of FIG. 1 implemented in CMOS logic.
Figure 3B:
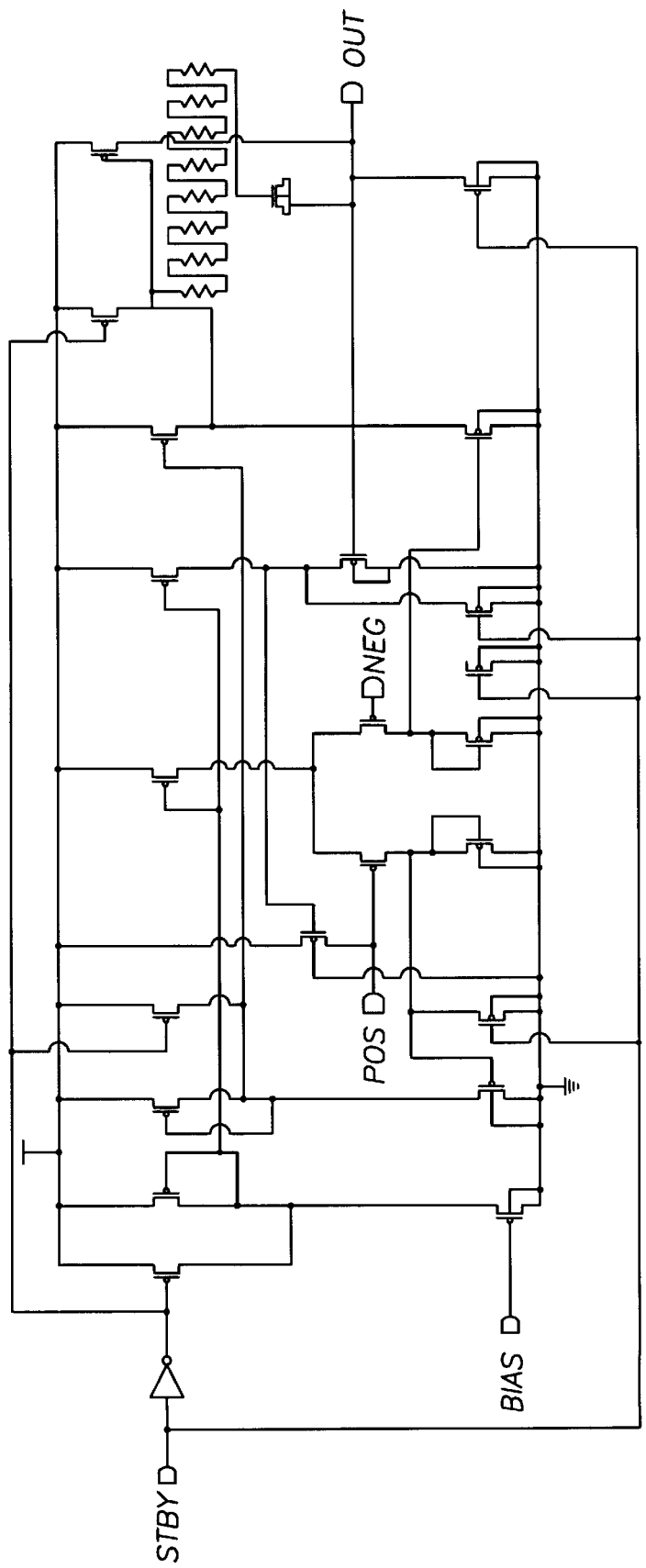
Figure 3C:
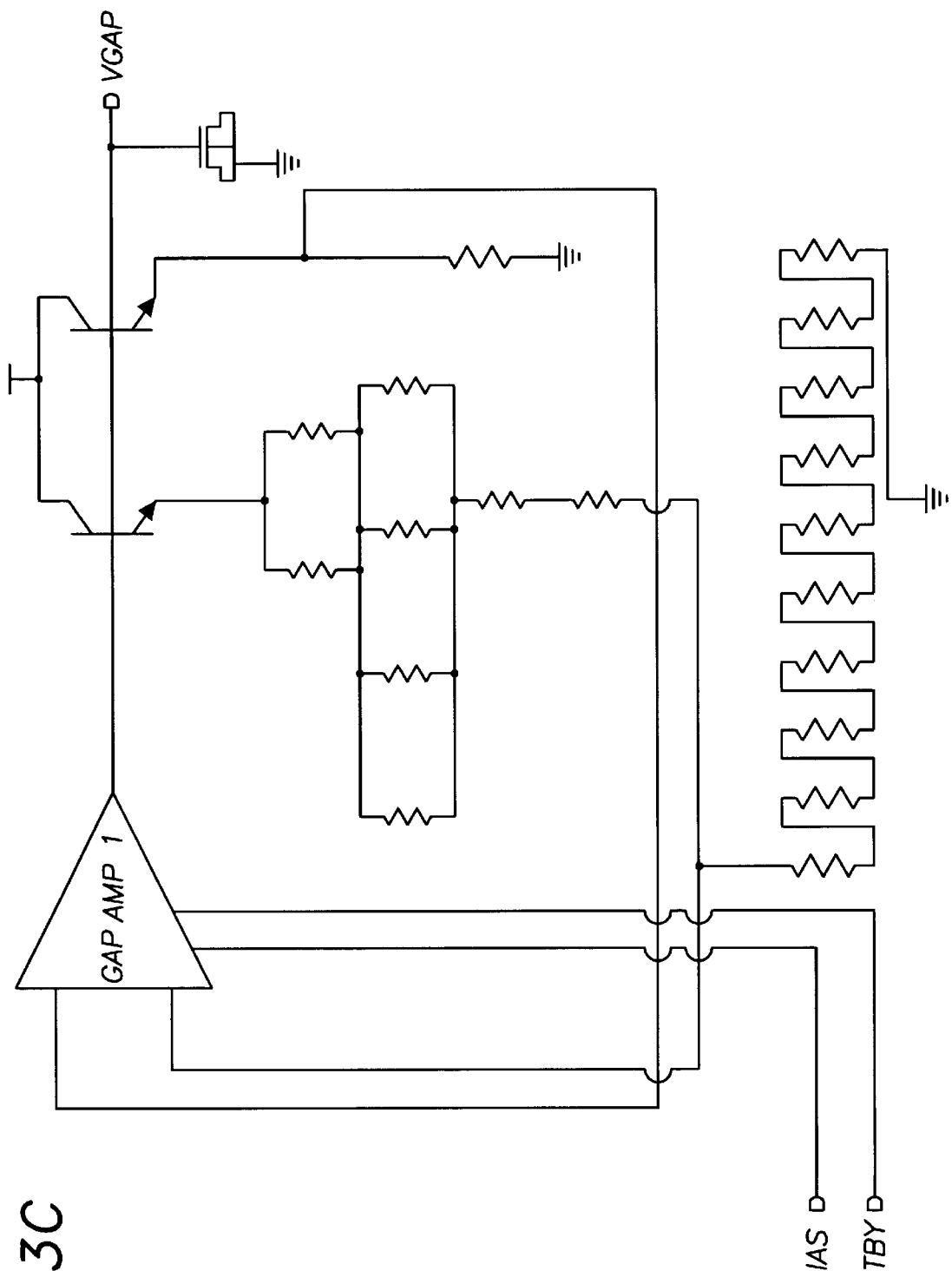
Figure 3D:
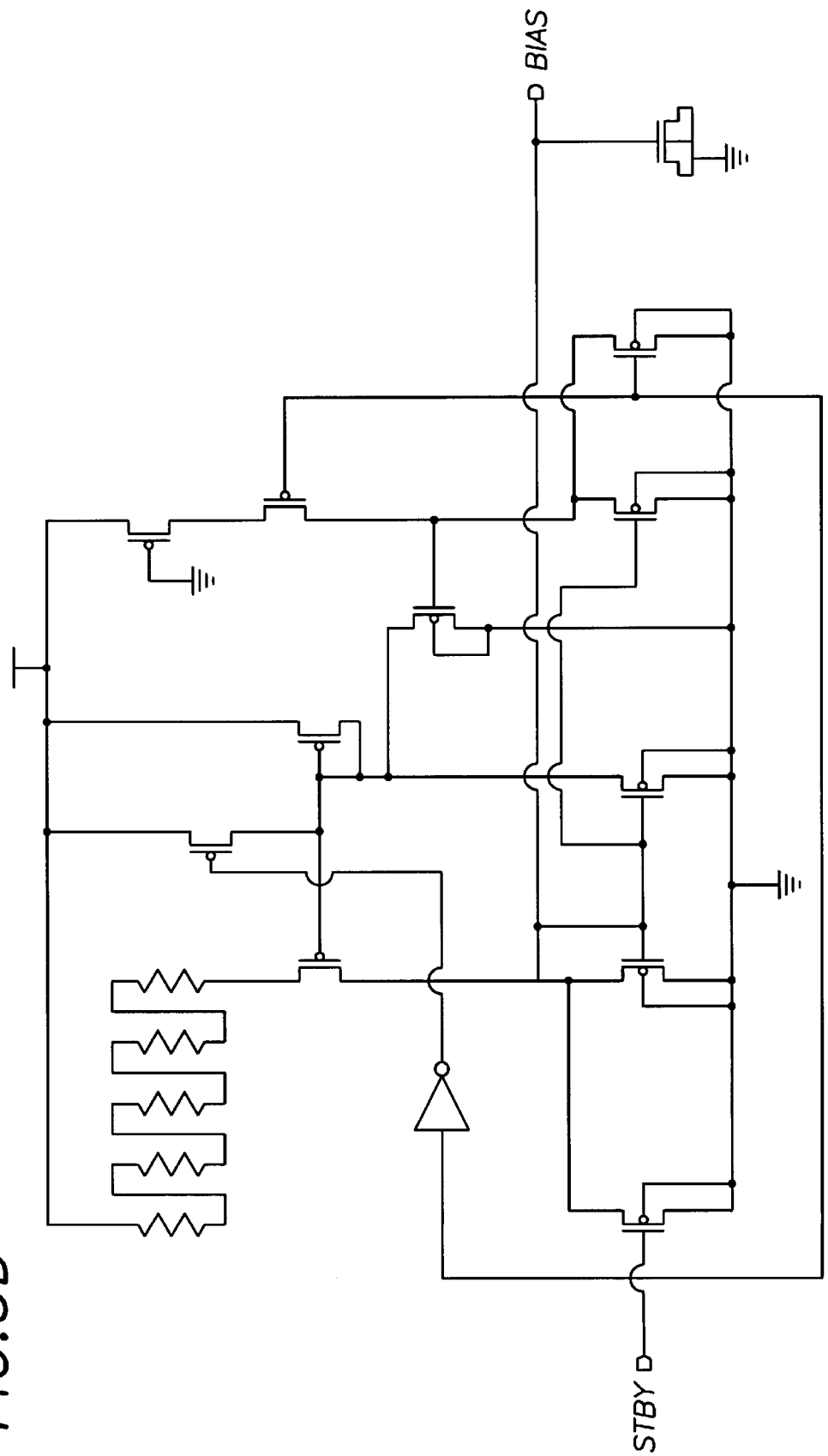
Figure 3E:
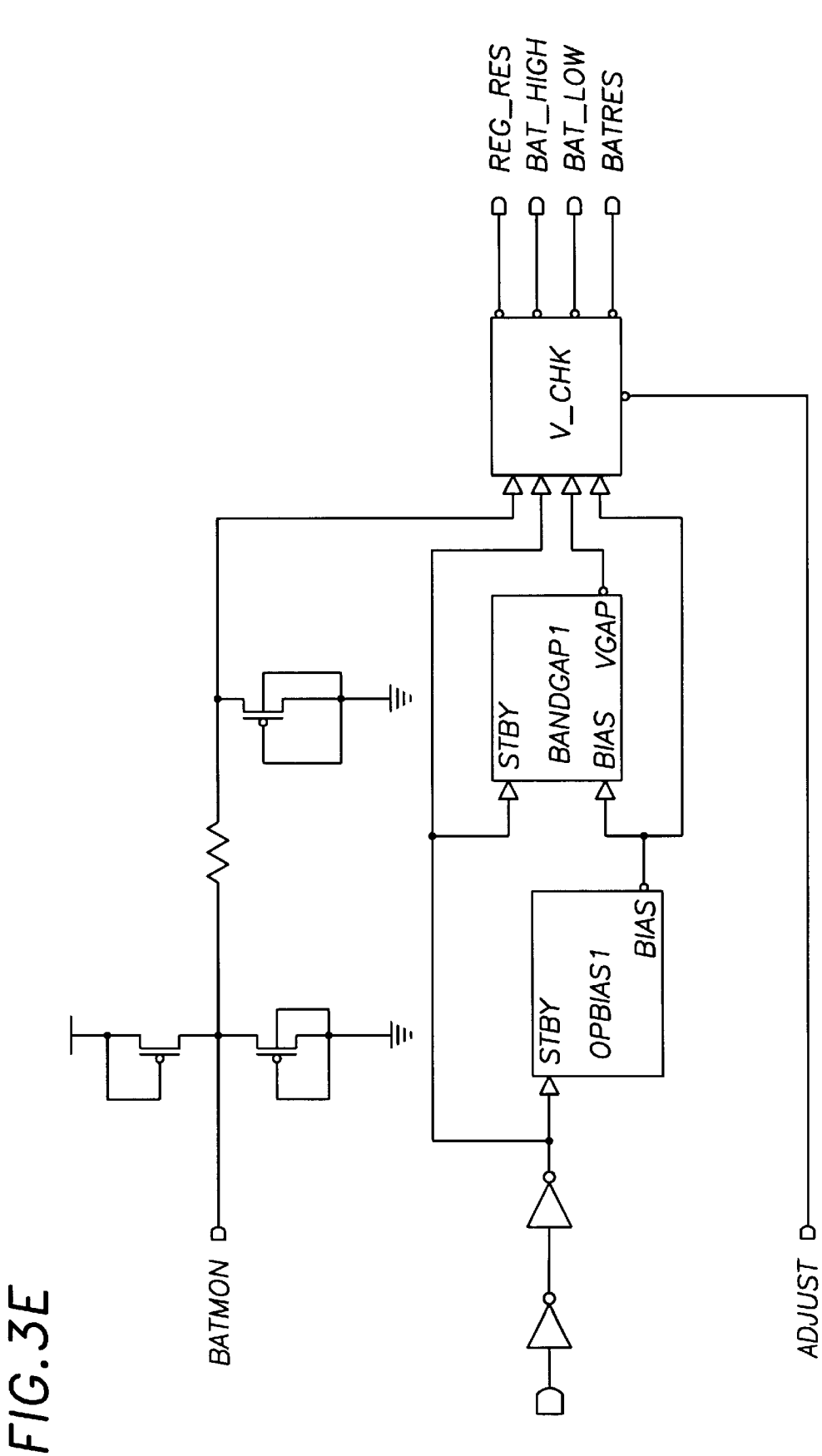
Figures 1, 3F:
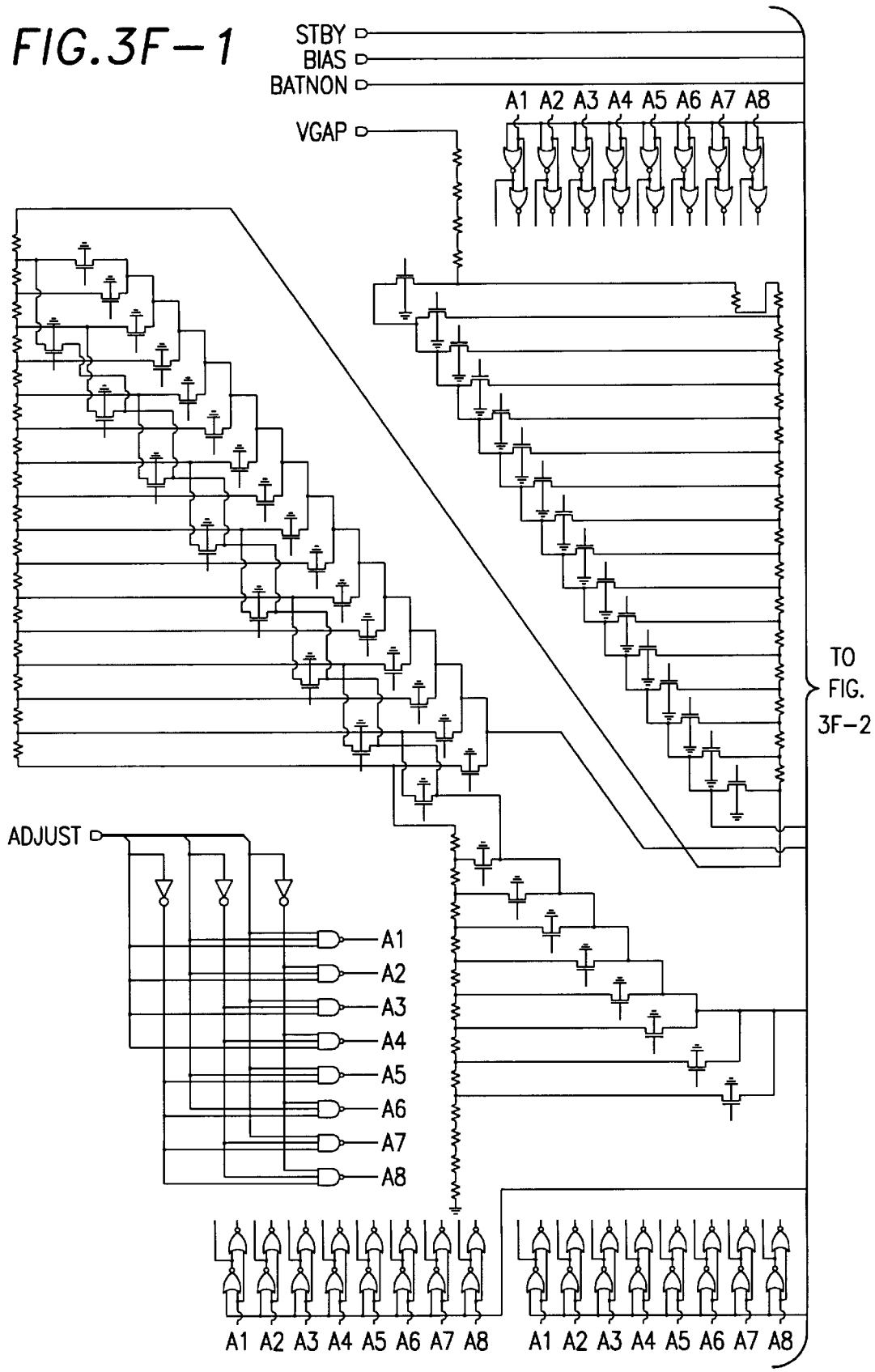
Figures 2, 3F:
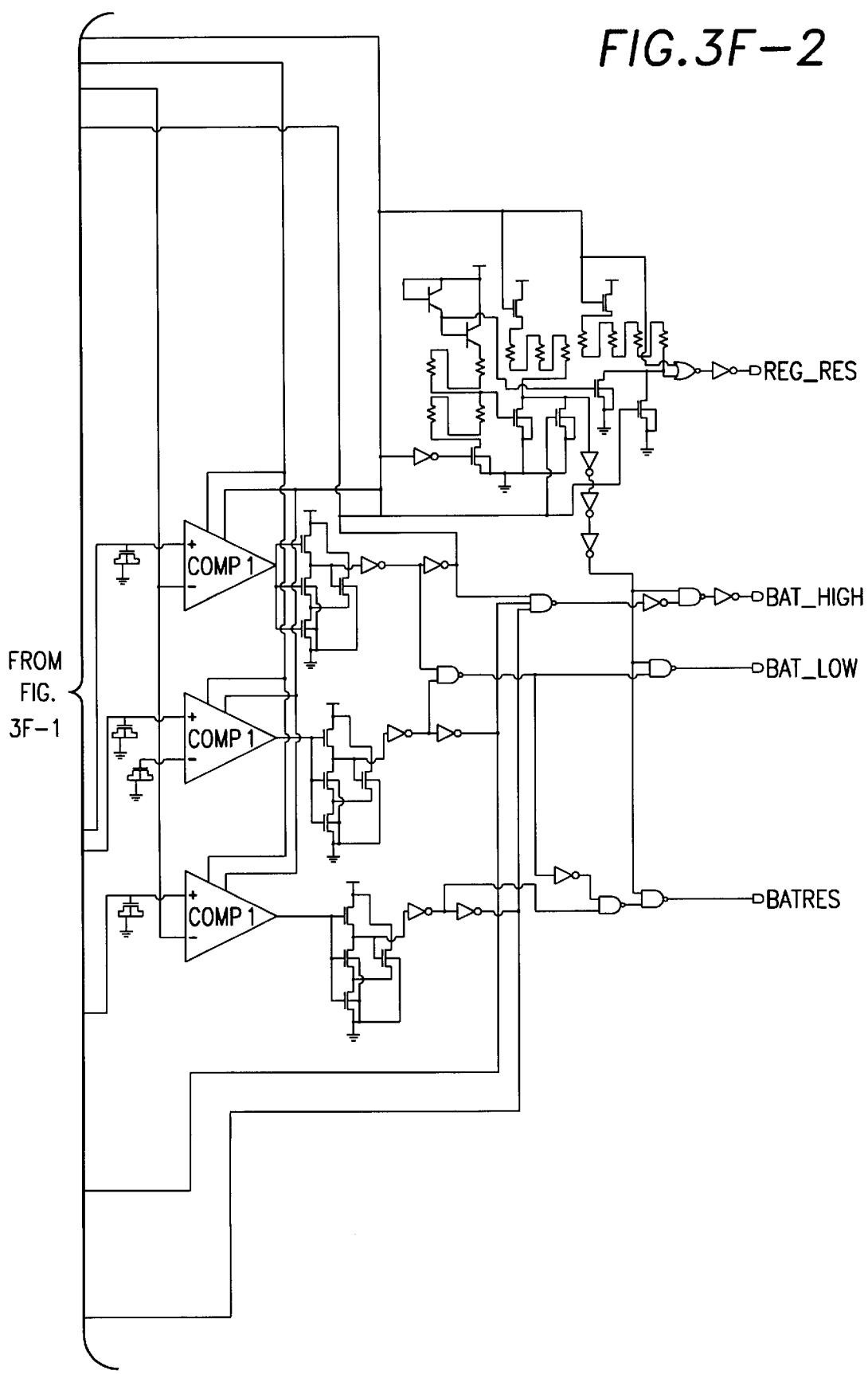

Referring now to FIG. 2, a detailed block diagram of an embodiment of the battery monitor 10 is shown. As shown in FIG. 2, the comparator circuit 14 is comprised of three comparators $C_1$, $C_2$ and $C_3$, an AND gate $AND_1$, and two NAND gates $NAND_1$ and $NAND_2$. The output of comparator C is connected as an input to the AND gate $AND_1$. The outputs of comparators $C_2$ and $C_3$ are connected, respectively, as inputs to the NAND gates $NAND_1$ and $NAND_2$. The second input of the AND gate $AND_1$ and the NAND gates $NAND_1$ and $NAND_2$ are connected to the voltage detect circuit 18.

The voltage reference circuit 16 is comprised of a band gap circuit 24 connected in series with a variable resistor Rv, and three additional resistors $R_3$, $R_4$ and $R_5$ which together comprise a voltage divider. It is understood that one skilled in the art could readily design a band gap circuit 24 that is capable of generating a stable output voltage across a broad range of supply voltages. The negative input of the first comparator $C_1$ is connected between the resistors $R_v$ and $R_3$, the negative terminal of the second comparator $C_2$ is connected between the resistors $R_3$ and $R_4$ and the negative input of the third comparator $C_3$ is connected between the resistors $R_4$ and $R_5$. The positive inputs of the comparators $C_1$, $C_2$ and $C_3$ are all connected between the resistors $R_1$ and $R_2$ forming the voltage divider across the battery 12.

The trim circuit 20 is comprised of a register 26 which is connected to a microprocessor 28. The microprocessor 28 is connected to an EEPROM 30 that, in the preferred embodiment, is located external to the integrated circuit 22. The output of the register 26 is connected to the variable resistor Rv and controls the resistance of the resistor Rv. Although not shown, it is understood that one skilled in the art could easily design a variable resistor the resistance of which is determined by the value stored in the register 26. For example, a number of individual resistances could be turned on or off depending upon the value in the register 26 to cause the variable resistor to have different values.

The operation of the battery monitor 10 will now be described. During normal operations, the battery 12 is in a fully charged state. In this situation, when the battery monitor 10 is activated, the microprocessor 28 reads the EEPROM 30, which contains a setting for the variable resistor $R_v$. The microprocessor 28 then copies the data from the EEPROM 30 into the register 26, which causes the resistance value of the variable resistor $R_v$ to be set. It is understood that the resistance value of the variable resistor $R_v$ is determined by testing the battery monitor 10 against desired design criteria. Since the fabrication of the battery monitor 10 in the integrated circuit 22, or the discrete components used to assemble the battery monitor 10, will have certain variability, the variable resistor $R_v$ provides a means to correct the accuracy of the battery monitor 10. The register 26 may have any number of bits that determine the resistance value of the variable resistor $R_v$. It is understood that the register 26 designed such that the upon startup, before the microprocessor 28 has written a new value to the register 26, it is originally set to provide an intermediate resistance valued for the variable resistor $R_v$. The register is able to adjust the value of the variable resistor $R_v$ above or below this resistance, depending upon the particular hardware design required.

With the resistance of the variable resistance $R_v$ determined, the voltages present at the negative terminals of the comparators $C_1$, $C_2$ and $C_3$ are determined by the variable resistor $R_v$, and resistors $R_3$, and $R_4$ and $R_5$. It is understood that the voltages present at the negative input of the comparator $C_1$ is higher than the negative input voltage of the comparator $C_2$, and the negative input voltage of the comparator $C_2$ is higher than the negative input voltage of the comparator $C_3$. The precise voltages present at the negative inputs of the comparators $C_1$, $C_2$ and $C_3$ are determined by the voltage generated by the band gap circuit 24 and the values of each of the resistors $R_v$, $R_3$ and $R_4$ and $R_5$.

The positive input of each of the comparators $C_1$, $C_2$ and $C_3$ is a scaled version of the battery 12 voltage generated by the $R_1$–$R_2$ voltage divider. The value present at the positive input of each of the comparators $C_1$, $C_2$ and $C_3$ is determined by the battery voltage and the values chosen for the resistors R1 and R2. It is understood that any number of trigger points can be created by choosing various combinations of the resistors $R_1$–$R_5$ and $R_v$.

In the embodiment shown, with the battery 12 in the fully charged mode, each of the comparators $C_1$, $C_2$ and $C_3$ have a voltage at their positive inputs higher than at their negative inputs which causes each comparator $C_1$, $C_2$ and $C_3$ to generate a high value. Further, with the battery 12 in a fully charged state to the voltage detect circuit 18 generates a high value, which results in the $BAT_{HIGH}$ output of the AND gate $AND_1$, to have a high output, with the $BAT_{LOW}$ and $BAT_{DEAD}$ outputs of the NAND gates $NAND_1$ and $NAND_2$, respectively, generate low outputs.

As the battery 12 begins to discharge during operation, its voltage level naturally begins to fall. This accordingly causes the voltage level at the positive inputs of the comparators $C_1$, $C_2$ and $C_3$ to fall in a linear fashion. One the voltage present at the positive input of the comparator $C_1$ generates a low signal. With the comparator $C_1$ generating a low output signal, the $BAT_{HIGH}$ signal generated by AND gate $AND_1$ falls, thus indicating that the battery 12 is no longer in a fully charged state.

As the battery 12 continues to discharge the voltage present at the positive input of the comparator $C_2$ will eventually fall below the voltage present at its negative input, and the comparator $C_2$ will generate a low signal. With the comparator C2 generating a low output signal, the $BAT_{LOW}$ signal generated by NAND gate $NAND_1$ rises, thus indicating that the battery 12 is in a low voltage state.

As the battery 12 continues to discharge the voltage present at the positive input of the comparator $C_3$ will eventually fall below the voltage present at its negative input, and the comparator $C_3$ will generate a low signal. With the comparator $C_3$ generating a low output signal, the $BAT_{DEAD}$ signal generated by NAND gate $NAND_2$ rises, thus indicating that the battery 12 is in a critical, or dead, voltage state.

It is understood that appropriate battery 12 charging circuitry can be triggered depending on the condition of the battery 12 charging circuitry can be triggered depending on the condition of the battery 12 as determined by the battery monitor 10. Accordingly, when the battery 12 begins to charge, the voltage seen at each of the positive inputs to the comparators $C_1$, $C_2$ and $C_3$ will begin to rise. As the voltage of the battery 12 begins to rise, the $BAT_{DEAD}$, $BAT_{LOW}$ and $BAT_{HIGH}$ outputs will change, generally, in a reverse order to that described in connection with the battery 12 discharge.

The comparators $C_1$, $C_2$ and $C_3$ may each be designed to exhibit certain hysteresis characteristics. Accordingly, the transition points for the $BAT_{DEAD}$, $BAT_{LOW}$ and $BAT_{HIGH}$ outputs can be altered depending upon whether the battery 12 voltage is increasing or decreasing. In fact, the order of activation of the $BAT_{DEAD}$ $BAT_{LOW}$ and $BAT_{HIGH}$ outputs can be varied by the use of hysteresis depending on whether the voltage is increasing or decreasing. This provides accurate characterization of the actual charge state of the particular battery type used.

FIGS. 3A–3F show schematic diagrams of an embodiment of the battery monitor 10 as implemented in CMOS circuitry. One skilled in the art will readily appreciate the specific embodiment shown therein.

The present invention has several advantages. For example, the ability to control the accuracy of the battery monitor 10 by the use of a programmable register 26 enables the elimination of fuse pads and their associated unreliability. Further, the use of hysteresis allows for more accurate modeling of the charge and discharge characteristics of the battery 12 being monitored. By providing greater accuracy in monitoring the battery 12 voltage, the battery monitor 10 is able to more reliably control the operation of a portable electronic device, providing longer use with decreased risk of unwanted electromagnetic transmissions.

Further, by integrating the battery monitor 10 in an integrated circuit 22 an external battery monitor 12 is not required. This reduces interconnectivity between the integrated circuit 22 and the board on which it is placed, saving overall board space and reducing the number of required external components.

It is understood that several variations may be made in the foregoing without departing from the scope of the invention. For example, the integrated circuit 22 need not be specifically designed for use in wireless communications, the EEPROM 30 may be any type of memory and can be on or off an integrated circuit 22 on which the battery monitor 10 is fabricated. The microprocessor 28 can be located on or off the integrated circuit 22, and need not be a fully functional microprocessor. The register 26 could be any storage device. The battery 12 voltage divider can be placed on or off the integrated circuit 22. Additionally, the battery monitor 10 can contain any number of comparators and any number of outputs, depending on the desired functionality.

Figure 4:
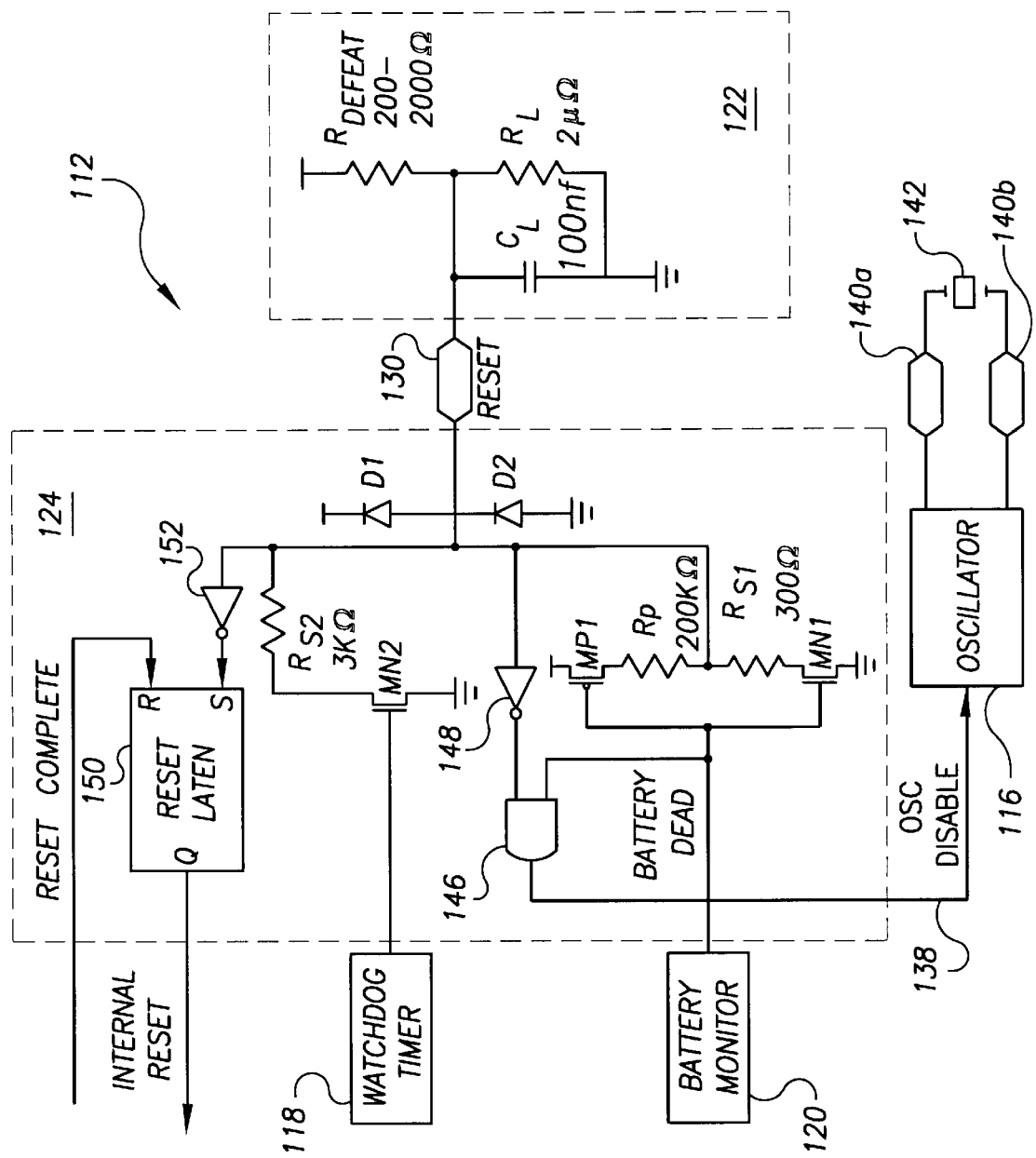
FIG. 4 is a schematic block diagram of an integrated circuit employing a reset circuit in accordance with the preset invention.

Referring to FIG. 4, the reference numeral 110 refers in general to an integrated circuit employing a reset circuit 112 embodying features of the present invention. In the preferred embodiment, the integrated circuit 110 is designed in any conventional manner for use in a wireless communication device and comprises the reset circuit 112, which is in communication with a microcontroller circuit 114 and an oscillator circuit 116, for purposes that will be described.

The reset circuit 112 is comprised of a watchdog timer 118, a battery monitor 120, and a passive pulldown, or level adjustment, circuit 122 external to the integrated circuit 110, all connected to reset logic 124. As one skilled in the art will readily appreciate, the software being executed by the microcontroller 114 is designed to cause the microcontroller 114 to periodically refresh the watchdog timer 118 to ensure that the microcontroller 114 and software processed by the microcontroller 114 are operating properly. If the microcontroller 114 fails to refresh the watchdog timer 118 within the prescribed period, the watchdog timer 118 outputs a timeout signal 126 to the reset logic 124 indicating that the watchdog timer 118 has not been properly refreshed by the microcontroller 114.

The battery monitor 116 is designed in a conventional manner to monitor the charge level of a battery (not shown) used to supply power to the integrated circuit 110. When the battery monitor 120 detects that the charge level of the battery has fallen below a predetermined charge level, it generates a dead battery signal 128 to the reset logic 124 for purposes that will be described.

The passive pulldown circuit 122 is located external to the integrated circuit 110 and is connected to the reset logic 124 through reset pin 130. The passive pulldown circuit 122 is comprised of the parallel combination of capacitor $C_L$ and resistor $R_L$ connected to ground. The passive pulldown circuit 122 may optionally contain a pullup resistor $R_{DEFEAT}$ connected between the reset pin 130 and $V_{CC}$ for purposes that will be described.

The reset circuit 112 communicates with the microcontroller 114 by an internal reset signal 132 to the microcontroller 114 and by a reset complete signal 134 to the reset logic 124. It is understood that the internal reset signal 132 and reset complete signal 134 may be connected to additional components on or off of the integrated circuit 110 to force the integrated circuit 110, or other components, into a known default state. The microcontroller 114 also communicates with the watchdog timer 118 by an 8-bit watchdog timer refresh signal 136 to the watchdog timer 118.

The reset circuit 112 additionally communicates with the oscillator 116 by an oscillator disable signal 138 generated by the reset logic 124. The oscillator 116 is similarly connected to oscillator pins 140a and 140b. A crystal 142 is connected external to the integrated circuit 110 to oscillator pins 140a and 140b to provide internal timing for the microcontroller 114.

Further, the reset circuit 112 communicates externally to the integrated circuit 110 by a bi-directional, reset signal 144 connected to reset pin 130. As in any conventional integrated circuit, the reset pin 130 protrudes from the integrated circuit 110 for connection to external components. In the embodiment shown, it is understood that the reset signal 144 is an active low signal.

Figure 5:
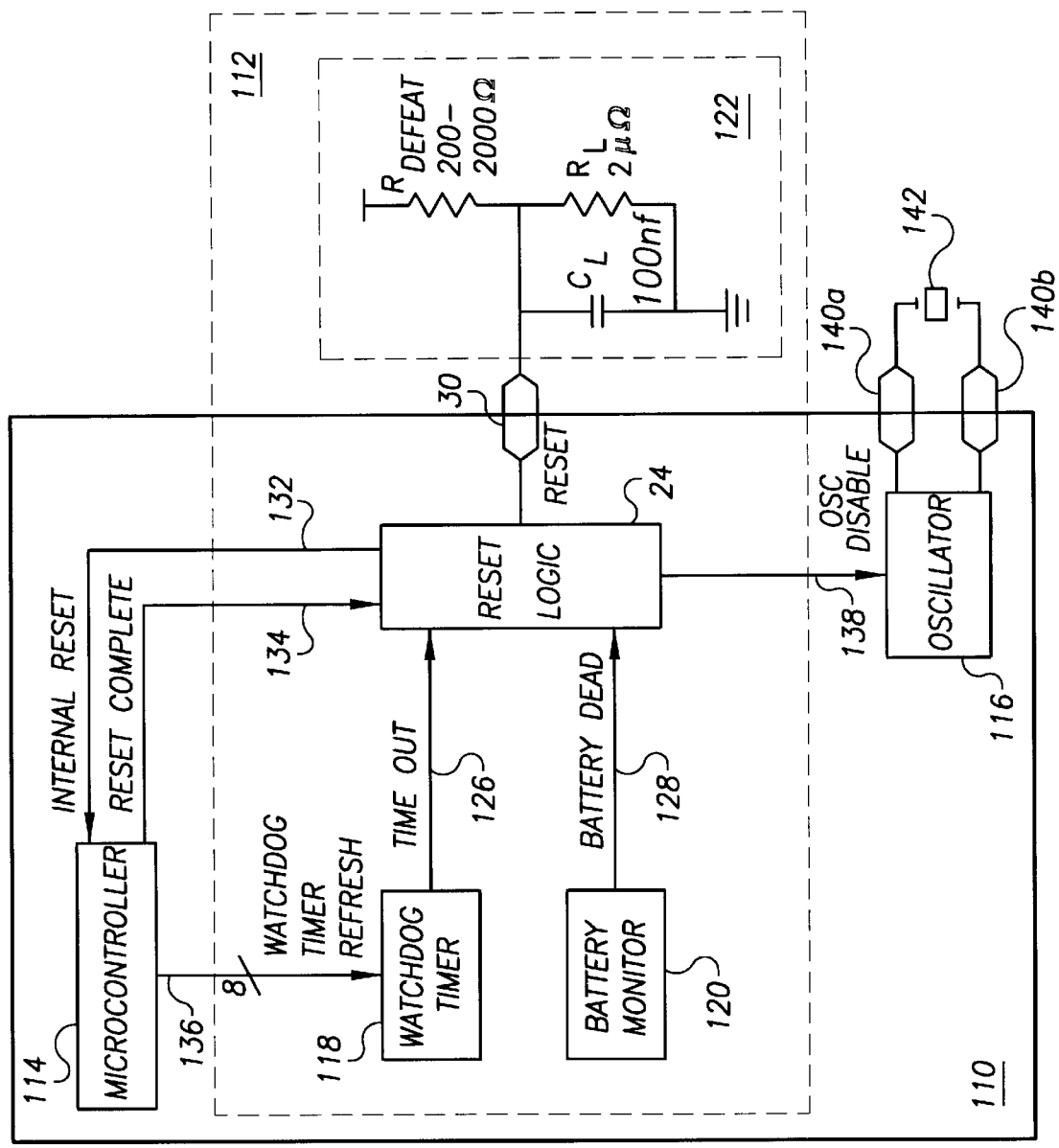
FIG. 5 is a detailed schematic block diagram of the reset circuit of FIG. 1.

FIG. 5 shows a detailed schematic of the reset circuit 112, and particularly the reset logic 124, according to the present invention. Within the reset circuit 112, the battery dead signal 128 of the battery monitor 120 is connected to the gate of p-channel field effect transistor (FET) MP1 and the gate of N-channel FET MN1. The source of FET MP1 is connected to $V_{CC}$ and the drain of FET MP1 is connected to the reset pin 130 through pull up resistor $R_P$. The source of FET $MN_1$ is connected to the reset pin 130 through resistor $R_{S1}$ and the drain of FET MN1 is connected to ground.

The dead battery signal 128 of the battery monitor is also connected as one input to AND gate 146. The other input of AND gates 146 is connected to the inverted reset dignal 144 through inverter 148. The output of AND gate 144 is connected to the oscillator 116 and serves as an oscillator disable signal 138.

The timeout signal 126 of the watchdog timer 118 is connected to the gate of n-channel FET MN2. The drain of FET MN2 is connected to the reset pin 130 through resistor $R_{S2}$ and the source of FET MN2 is connected to ground.

An RS latch 150 is used to provide at its Q output the internal reset signal 132 to the microcontroller 114. The S input of the RS latch 150 is the inverted reset signal 144 generated by inverter 152. The R input of the RS latch 150 is connected to the reset complete signal 134 generated by the microcontroller 114.

Diode D1 is connected between the reset pin 130 and $V_{CC}$, and diode D2 is connected between the reset pin 130 and ground. Diodes D1 and D2 are provided to protect against electrostatic discharge. D1 also safely discharges the load capacitance to $V_{CC}$ in the event of a sudden drop in the $V_{CC}$ level.

In operation, the charge level of the battery is ordinarily above a predetermined charge level, such that the battery monitor 120 generates a low dead battery signal 128 to the gates of FETs MN1 and MP1. With a low battery dead signal 128 present at the gate of FET MN1, FET MP1, is turned off, prohibiting any current from flowing through RS1 to ground. However, with a low dead battery signal 128 present at the gate of FET MP1, FET MP1 is turned on such that current flows from $V_{CC}$ through both $R_P$ and the passive pull down circuit 122 to ground. With MP1 turned on, the resistor divider created by $R_P$ and $R_L$ causes a high reset signal 144, indicating that a reset is not requested.

A low dead battery signal 128 also causes the AND gate 146 to generate a low oscillator disable signal 138, which permits the various clocks and the microcontroller 114 on the integrated circuit 110 to continue operation.

With the battery in a sufficiently charged state, the microcontroller 114 is free to operate and must refresh the waterdog timer 118 periodically to prevent the generation of the timeout signal 126. In the present invention, the microcontroller 114 must write a specific sequence of bits to the watchdog timer 118 on the line 136 to refresh the watchdog timer 118. In normal operations, the watchdog timer 118 is properly refreshed and generates a constant low time out signal 126 to the gate of FET MN2. With a low signal present at the gate of FET MN2, FET MN2 is turned off, prohibiting current from flowing through $RS_2$ to ground, which enables RP and $R_L$ to maintain the rest signal 144 at a high level.

If the microcontroller 114 fails to write the specified sequence to he watchdog timer 118, the watchdog timer then pulses the time out signal 126 high. When a high time out signal 126 is present at the gate of FET MN2, FET MN2 is turned on, which permits current flow through $R_{S2}$ to ground. If the battery monitor 120 is generating a low dead battery signal 128, current will flow from $V_{CC}$ through $R_P$ and through the parallel combination of $R_{S2}$ and $R_L$. the value of $R_{S2}$ is chosen to assure that the resistor divider created by RP and the parallel combination of $R_{S2}$ and $R_L$ causes a low reset signal 44, indicating that a reset is requested. Further, the value of $C_L$ is chosen such that the time consistent of the discharge of $C_L$ is smaller than the duration of the time out signal 126 to assure that the reset signal 144 will arrive at a low level before MN2 is turned off.

With the reset signal 144 low, the S input of RS latch 150 is driven high by inverter 152, thus causing the Q output of RS latch 150 to go high. This signals the microcontroller 114 that a reset has been requested and the microcontroller 114 goes through its reset sequence. By utilizing the RS latch 150, the reset logic 124 is effectively able to extend the duration of the internal reset signal 132 until the microcontroller 114 has completed its reset operations. Further, the use of RS latch 150 protects against repeated resets, or other unpredictable operations, which might be caused by a noisy reset signal 144. When the microcontroller 114 has completed its reset sequence, it pulses the reset complete signal 134 high, which drives the R input of RS latch 150 high and causes the Q output to change to a low level. If the reset signal 144 is still at a low level, the Q output will again change to a high level and the microcontroller 114 will repeat its reset sequence. Normally, however, the reset signal 144 will have changed to a high level, as a result of FET MN2 being turned off, and the microcontroller 114 will proceed with normal operations.

When the battery monitor 120 detects that the charge level of the battery has fallen below a predetermined value, the battery monitor 120 generates a high dead battery signal 128 at the gates of FETs MP1 and MN1, which turns off FET MP1 and turns of FET MN1. With MN1 turned on, the charge stored in $C_L$ is discharged through $R_L$ and $R_{S1}$ to ground, causing a low reset signal 144 which indicates that a reset is requested. In this condition, both of the inputs to AND gate 146 are high, resulting in a high oscillator disable signal 138 that causes the clocks on the integrated circuit 110 to stop functioning and effectively halts the microcontroller's 114 operations. While the presence of a low reset signal 144 will cause the Q out put of RS latch 150 to go high, since the microcontroller 114 has ceased operating, the internal reset signal 132 has no practical effect in this condition.

Since the oscillator disable signal 138 is only high when both the dead battery signal 128 and the reset signal 144 are true, the oscillator 116 is only disabled if the battery is dead, and is not affected by the watchdog timer timeout. It is understood that the oscillator 116 is disabled to conserve energy when the battery has fallen below a critical level. By only disabling the oscillator 116 in a dead battery condition, the oscillator 116 does not have to recycle and spin up for every reset.

The passive pulldown circuit 122, consisting of capacitor $C_L$ and $R_L$ are specifically designed to discharge any voltage built up on $C_L$ in the event that power is lost to the integrated circuit 110 in such a manner that none of the FETs MP1, MN1, or MN2 are operational.

Additionally, by making the reset signal 144 bi directional, it is possible to force the integrated circuit 10 into reset by pulling the reset signal 144 low using external circuitry (not shown) attached to reset pin 130.

$R_{DEFEAT}$ may be optionally used to assist in testing of the integrated circuit 110. With an appropriately chosen value of $R_{DEFEAT}$, the value of the reset signal 144 can be maintained at a high level regardless of whether any of the FETs MP1, MN1 or MN2 are active. For example, during testing of the integrated circuit 110, the watchdog timer 118 may not be refreshed and will attempt to cause a reset. This is undesirable because repeated resets would prevent sufficient testing of the integrated circuit 110. Further, during testing it may be desirable to allow oscillator 116 to continue operation even when the battery monitor 120 has detected a low battery level. Accordingly, by the use of $R_{DEFEAT}$ tied to $V_{CC}$, to hold the reset signal 144 high, AND gate 146 will not generate a high oscillator disable signal 138 even if the battery monitor 120 detects a low battery condition. As one skilled in the art will readily appreciate, it is possible to select a value for $R_{DEFEAT}$ which will hold the reset signal 144 high during a watchdog timer 118 time out and yet allow the reset signal 144 to drop low when a dead battery signal 128 occurs.

The present invention has several advantages. For example, by causing the integrated circuit 110 to reset when the software is not operating properly, as well as when the battery has fallen below a predetermined charge level, the integrated circuit prevents the transmission of undesirable electromagnetic signals.

Further, but integrating the battery monitor 120 and the watchdog timer 118 into the integrated circuit 110 in connection with the reset logic 124, an external battery monitor 120 is not required. This reduces interconnectivity between the integrated circuit 110 and the board on which it is placed, saving overall board space and reducing the number of required external components.

Further, through the utilization of a passive pulldown circuit 136, the reset signal 144 will be brought low if none of the FETs MN1, MN2 and MP1 is functioning.

Moreover, AND gate 146 enables the oscillator 116 to be disabled only when the battery is dead and the reset is not overridden externally.

It is understood that several variations may be made in the foregoing without departing from the scope of the invention. For example, the integrated circuit need not be specifically designed for use in wireless communications. Additionally, AND gate 146 may have any number of additional inputs, the values for the various resistors and capacitors may differ, and different logic circuits may be utilized.

Although illustrative embodiments of the invention have been shown and described, a wide range of modification, change, and substitution is contemplated in the foregoing disclosure and in some instances, some features of the present invention may be employed without a corresponding use of the other features. Accordingly, it is appropriate that the appended claims be construed broadly and in a manner consistent with the scope of the invention.

What is claimed is:

1. A battery monitor for monitoring a voltage level of a battery in a portable telephone, the battery monitor comprising:

means including a programmable register for generating a plurality of reference voltages as a function of data stored in the programmable register;

means for simultaneously comparing the plurality of reference voltages with the voltage level of the battery; and wherein the comparing means generates at least one output signal when the voltage level of the battery is equal to the reference voltage.

2. The battery monitor of claim 1, further comprising means for trimming the reference voltages generated by the reference voltage means.

3. A battery monitor for monitoring a voltage level of a battery in a portable telephone, the battery monitor comprising:

a comparator circuit arranged to be coupled to the battery to receive a voltage level therefrom;

a voltage reference circuit coupled to the comparator circuit, the voltage reference circuit including a band gap circuit coupled in series with a variable resistor and a voltage divider and arranged to simultaneously provide a plurality of reference voltage levels to the comparator circuit;

a trim circuit, including a programmable register coupled to the variable resistor, the trim circuit arranged to adjust the contents of the programmable register, wherein the plurality of reference voltage levels are generated as a function of data stored in the programmable register; and wherein the comparator circuit is further arranged to compare the voltage level of the battery with the plurality of voltage levels and generate an output based on results of the comparison.

4. The battery monitor of claim 3 wherein the trim circuit is programmable.

5. The battery monitor of claim 3 wherein the trim circuit comprises a microprocessor coupled to the programmable register and a memory device, the memory device containing trim data, the microprocessor configured and arranged to read the trim data from the memory device and write the trim data to the programmable register to control the at least one reference voltage.

6. The battery monitor of claim 3 wherein the comparator circuit comprises at least one comparator.

7. The battery monitor of claim 3 wherein the comparator circuit comprises circuitry to provide hysteresis.

8. A monitor for detecting characteristics of a battery in a portable telephone, the monitor comprising:

a first voltage divider coupled in parallel with the battery;

a plurality of comparators coupled to the first voltage divider to receive a voltage level of the battery;

a first control circuit including a programmable register; p1 a voltage reference circuit coupled to the programmable register and to the plurality of comparators, the voltage reference circuit arranged to simultaneously generate a plurality of reference voltages to the comparators as a function of data stored in the register; and wherein the comparators are arranged to generate outputs indicative of characteristics of the battery when the battery voltage level reaches a predetermined value compared to the reference voltages.

9. The monitor of claim 8, wherein the plurality of comparators are arranged to detect a high battery voltage level, a low battery voltage level, and a dead battery voltage level.

10. The monitor of claim 8, wherein the voltage reference circuit comprises a band gap voltage generator coupled to a second voltage divider, the second voltage divider having outputs coupled to the comparators.

11. The monitor of claim 10, wherein the voltage reference circuit comprises a variable resistor coupled in series with the second voltage divider.

12. The monitor of claim 11, wherein the trim circuit comprises a microprocessor coupled to a programmable register and a memory, wherein the microprocessor is configured and arranged to read a value stored in the memory and write the read value to the register, the value written to the register determining the resistance of the variable resistor.

* * * * *

UNITED STATES PATENT AND TRADEMARK OFFICE
CERTIFICATE OF CORRECTION

PATENT NO. : 6,118,384
DATED : September 12, 2000
INVENTOR(S) : Sheldon et al.

It is certified that error appears in the above-identified patent and that said Letters Patent is hereby corrected as shown below:

<u>Title page,</u>
Item [57], ABSTRACT,
Line 4, "a at" should read -- at --.

<u>Column 1,</u>
Line 28, "devise" should read -- device --.
Line 29, "condition" should read -- conditions --.
Line 39, "increases" should read -- increase --.
Line 67, please delete the second occurrence of "is".

<u>Column 2,</u>
Line 9, "is," should read -- is, --.

<u>Column 3,</u>
Line 25, "10" should read -- 10 is --.
Line 31, "$V_3$." should read -- $V_3$ --.

<u>Column 4,</u>
Line 28, please delete the second occurrence of "the".
Line 31, "valued" should read -- value --.
Line 40, "is" should read -- are --.
Line 61, "state to" should read -- state, --.

<u>Column 5,</u>
Line 2, "One" should read -- Once --.
Lines 25-26, please delete "charging circuitry can be triggered depending on the condition of the battery 12".

<u>Column 6,</u>
Line 63, "external" should read -- externally --.

<u>Column 7,</u>
Line 18: "dignal" should read -- signal --.

UNITED STATES PATENT AND TRADEMARK OFFICE
CERTIFICATE OF CORRECTION

PATENT NO.   : 6,118,384
DATED        : September 12, 2000
INVENTOR(S)  : Sheldon et al.

It is certified that error appears in the above-identified patent and that said Letters Patent is hereby corrected as shown below:

Column 8,
Line 2, "he" should read -- the- -.
Line 8, "RL. the" should read -- RL. The --.
Line 41, "of" should read -- on --.
Line 49, "out put" should read -- output --.

Column 10,
Line 57: please delete "p1".

Signed and Sealed this

Twenty-eighth Day of January, 2003

JAMES E. ROGAN
*Director of the United States Patent and Trademark Office*

UNITED STATES PATENT AND TRADEMARK OFFICE
CERTIFICATE OF CORRECTION

PATENT NO.   : 6,118,384
DATED        : September 12, 2000
INVENTOR(S)  : Sheldon et al.

It is certified that error appears in the above-identified patent and that said Letters Patent is hereby corrected as shown below:

Title page,
Item [57], ABSTRACT,
Line 4, "a at" should read -- at --.

Column 1,
Line 28, "devise" should read -- device --.
Line 29, "condition" should read -- condistions --.
Line 39, "increases" should read -- increase --.
Line 67, please delete the second occurrence of "is".

Column 2,
Line 9, "is," should read -- is, --.

Column 3,
Line 25, "10" should read -- 10 is --.
Line 31, "$V_3.$" should read -- $V_3$ --.

Column 4,
Line 28, please delete the second occurrence of "the".
Line 31, "valued" should read -- value --.
Line 40, "is" should read -- are --.
Line 61, "state to" should read -- state, --.
Line 65, "generate" should read -- generating --.

Column 5,
Line 2, "One" should read -- Once --.
Lines 25-26, please delete "charging circuitry can be triggered depending on the condition of the battery 12".

Column 6,
Line 63, "external" should read -- externally --.

Column 7,
Line 18, "dignal" should read -- signal --.

UNITED STATES PATENT AND TRADEMARK OFFICE
CERTIFICATE OF CORRECTION

PATENT NO. : 6,118,384
DATED : September 12, 2000
INVENTOR(S) : Sheldon et al.

It is certified that error appears in the above-identified patent and that said Letters Patent is hereby corrected as shown below:

Column 8,
Line 2, "he" should read -- the --.
Line 8, "RL. the" should read -- RL. The --.
Line 41, "of" should read -- on --.
Line 49, "out put" should read -- output --.

Column 10,
Line 57, please delete "p1".

This certificate supersedes Certificate of Correction issued January 28, 2003.

Signed and Sealed this

Sixth Day of December, 2005

JON W. DUDAS
*Director of the United States Patent and Trademark Office*